United States Patent [19]

Rosini

[11] Patent Number: 4,926,376
[45] Date of Patent: May 15, 1990

[54] METHOD OF DESIGNING INTEGRATED MICROCOMPUTERS AND INTEGRATED MICROCOMPUTER WITH MODULAR STRUCTURE OBTAINED BY SAID METHOD

[75] Inventor: Paolo Rosini, Monza, Italy

[73] Assignee: SGS Microelettronica S.p.A., Catania, Italy

[21] Appl. No.: 380,680

[22] Filed: Jul. 14, 1989

Related U.S. Application Data

[63] Continuation of Ser. No. 30,137, Mar. 26, 1987, abandoned.

[30] Foreign Application Priority Data

Jun. 27, 1986 [IT] Italy .................... 20942 A/86

[51] Int. Cl.$^5$ ............................................. G06F 13/00
[52] U.S. Cl. ............................ 364/900; 364/925.6; 364/929.2; 364/935.4

[58] Field of Search ... 364/200 MS File, 900 MS File; 439/75, 716

[56] References Cited

U.S. PATENT DOCUMENTS

| | | | |
|---|---|---|---|
| 3,234,433 | 2/1966 | Braunagel | 439/75 |
| 3,972,028 | 7/1976 | Weber et al. | 364/200 |
| 4,090,764 | 5/1978 | Malsby et al. | 439/716 |
| 4,214,302 | 7/1980 | Schmidt | 364/200 |
| 4,514,799 | 4/1985 | Spencer et al. | 364/200 |

*Primary Examiner*—Thomas M. Heckler
*Attorney, Agent, or Firm*—Cushman, Darby & Cushman

[57] ABSTRACT

The microcomputer is assembled by association of a variable plurality of rectangular functional modules having a fixed first dimension and a variable second dimension. Common busses electrically connect the various modules automatically.

4 Claims, 1 Drawing Sheet

METHOD OF DESIGNING INTEGRATED MICROCOMPUTERS AND INTEGRATED MICROCOMPUTER WITH MODULAR STRUCTURE OBTAINED BY SAID METHOD

This is a continuation of Application No. 07/030,137, filed Mar. 26, 1987, which was abandoned upon the filing hereof.

BACKGROUND OF THE INVENTION

1. Field of the Invention

The present invention relates to a method of designing integrated microcomputers as well as an integrated microcomputer with modular structure obtained by said method.

2. Description of the Related Art

At present each microcomputer is distinguished from the others by the kind and number of functions provided. This means that each time it is desired to add or delete a function it is necessary not only to replace the microcomputer but actually redesign it partially or totally. This implies a long development time for new versions and chances of introducing errors in the reprocessing of parts already tested in previous versions. In practice this increases the cost of the device and limits the number of versions which may be accomplished.

Alternatively there is provided the accomplishment of the largest possible number of functions in a single microcomputer version so as to satisfy as far as possible the need for various classes of applications. This of course involves in many cases an excess of functions compared with the needs of a specific class of applications, making the solution uneconomical and hence in practice narrowing the chances of employment of the microcomputer. In addition, the system is not open to subsequent extension except at the cost of partial or total redesign.

Another alternative calls for accomplishment of a library of independent modules each built so as to minimized the silicon area occupied by the individual module. The various modules thus have uncorrelated forms and sizes and the electrical terminals carrying the signals necessary for the interconnections between the modules are positioned topologically in different ways. This involves a huge waste of silicon area because of the interconnections between the modules and the technical need for obtaining a regular rectangular form of the chip containing all the required modules. In general the total resulting area is more than double that of the active area effectively used by the starting modules. This considerably increases the production cost of the microcomputer and limits the maximum number of functions technically feasable in a single component.

SUMMARY OF THE INVENTION

In view of this state of the art the object of the present invention is to make available an integrated microcomputer which by overcoming the abovesaid shortcomings would be designed specifically to permit increase and reduction of the functions provided.

To this end the method in accordance with the invention is characterized in that it comprises assembly of the microcomputer in the form of a variable plurality of rectangular functional modules having a fixed first dimension and a variable second dimension each of which fulfills a different function and can be combined with that of the other modules.

The various modules can be constructed on interchangeable independent supports or on a common support without further waste of silicon area for the module interconnections. No further design time is required; it being sufficient to unite a variable number of modules already designed.

Thus is obtained an integrated microcomputer with a modular structure which in accordance with the invention consists of a variable plurality of rectangular modules having a fixed first dimension and a variable second dimension said modules being interconnected by busses and structurally joined to the interior of a rectangular peripheral frame having a first dimension corresponding to said first dimension of the modules and a second dimension corresponding to the sum of said second dimensions of the modules said frame containing terminals for interconnection with the exterior of the microcomputer and the related interface circuitry.

The various modules can also constitute a single whole or be physically separated, independent and interchangeable. In the former case the structure of the modules is such that it permits simply bringing together said modules topologically so that all the electrical interconnections necessary for integrated operation of the various modules are automatically accomplished.

It appears clear that the design method and the microcomputer in accordance with the invention permit ready generation of a great number of integrated microcomputer configurations, each answering the needs of a specific class of applications starting from a limited number of basic modules.

In particular it should be noted that (a) there is no further waste of silicon area and hence of production costs to make the module interconnections; (b) no further design costs are necessary for the various module configurations, which are designed only once and then used as they are without modification since they already contain the interconnections necessary for the exchange of signals among them; (c) the time to accomplish a new configuration, i.e. a new integrated microcomputer containing all the functions specifically required for a given class of applications, especially concerning the design phase thereof is greatly reduced; and (d) the changes of making design errors in generating a new configuration are virtually reduced to zero.

BRIEF DESCRIPTION OF THE DRAWINGS

For better understanding of the characteristics of the present invention reference may be made to the annexed drawings wherein.

DESCRIPTION OF THE PREFERRED EMBODIMENT

Figure 1:
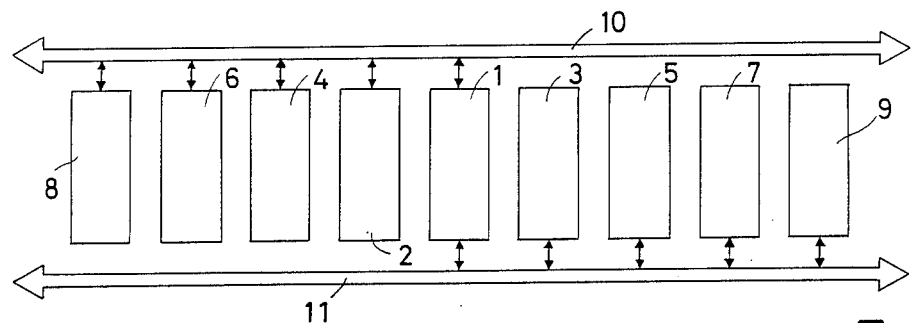
FIG. 1 shows a block diagram of an integrated microcomputer with modular structure in accordance with the present invention assumed to consist of a plurality of optional modules.

In FIG. 1 there is assumed the accomplishment of a microcomputer formed for example of nine modules thus constituted:
1 CPU central processing unit
2 ROM memory array 3 EPROM memory array
4 EEPROM memory array
5 RAM memory array
6 Serial communication unit (SIO)
7 Parallel communication unit (PIO)
8 Timing unit
9 Analog-digital conversion unit Some of these modules can be omitted and others with different functions may be added. In addition more than one of some modules can be inserted depending on the needs of the specific application.

Figure 3:
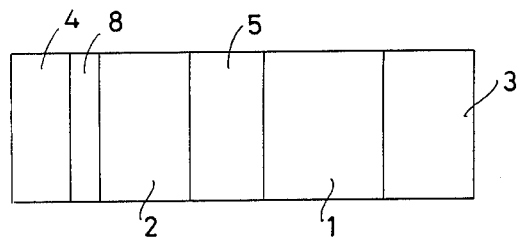
Figure 4:
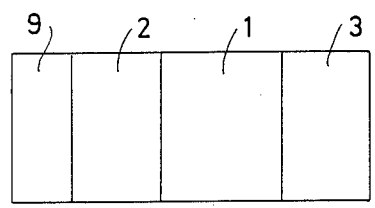
Figure 5:
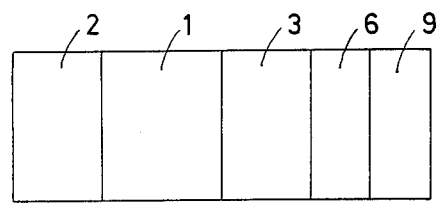

With a limited number of modules it is possible to construct several thousand significantly different configurations from among which may be selected the most suitable. Some of these configurations are illustrated schematically in FIGS. 3-5.

Figure 2:
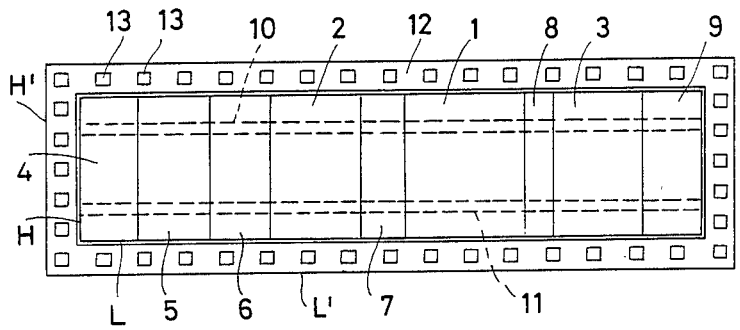
FIG. 2 shows a more structural version of said microcomputer with the same functional modules as in FIG. 1, and FIGS. 3-5 show schematic representations of alternative microcomputer configurations in accordance with the invention.

Constructively as shown in FIG. 2 all the modules 1-9 are rectangular and have a fixed first dimension H and a second dimension L variable depending on the complexity of the circuits of the individual modules. In the case illustrated they are constructed on separate independent supports. Alternatively they can be constructed after designing on a common support.

The functional interconnections between the various modules are accomplished by means of buses 10 and 11 (FIG. 1) topologically placed in predetermined positions which are the same for all modules perpendicular to the side with fixed dimension H of said modules (FIG. 2). In this manner two modules placed close together are automatically connected electrically. This is true for the supply and ground lines, which are common to all the modules.

As shown in FIG. 2 the entirety of modules 1-9 forming the microcomputer chip is enclosed in a rectangular frame 12 which has a fixed first dimension H' corresponding to the fixed dimension H of the various modules and a variable second dimension L' corresponding to the sum of the variable dimensions L of said modules. In said frame 12 is accomplished the interface circuitry and thereon are accomplished various terminals 13 which provide connection of the chip with the exterior, specifically with the usual mechanical container of said chip. The terminals 13 are also accomplished in such a manner as to have a rectangular form with a common dimension even though different from and in general much smaller than the fixed dimension of the functional modules 1-9.

I claim:

1. A method for forming a one-chip integrated microcomputer, comprising the steps of:
   (a) designing a plurality of rectangular functional silicon chip modules each having a first side of the same length and a second side of variable length and provided with bus portions extending through each module parallel to said second side and at a distance therefrom which is the same in all modules with each said module capable of performing a different computing function;
   (b) assembling a selected number of said modules by arranging them with the respective first sides adjacent each other while electrically interconnecting them by coupling said bus portions to form at least one common bus extending through the module assembly parallel to said second side of the modules, wherein said selected number of said modules includes a required number of said modules to perform required computing functions and a variable number of said modules to perform specialized functions for a particular application thereby minimizing the silicon area used with the assembled modules.

2. A method according to claim 1, further comprising the step of arranging the module assembly within a rectangular containing frame having a first inner side of the same length as said first side of the modules and a second inner side of a length equal to the sum of the lengths of said second sides of the modules.

3. A one-chip integrated microcomputer, comprising:
   (a) a selectable number of rectangular functional silicon chip modules each having a first side of the same length and a second side of variable length, said modules being arranged with the respective first sides adjacent each other, wherein said selectable number of rectangular functional silicon chip modules includes a required number of said modules to perform required functions and a variable number of said modules to perform specialized functions for a particular application; and
   (b) at least one electrical bus for electrically interconnecting said modules, said bus extending through said modules parallel to said second sides of the modules and at a distance therefrom which is the same in all modules.

4. A microcomputer according to claim 3 wherein said modules are arranged within a rectangular containing frame having a first inner side of the same length as said first side of the modules and a second inner side of a length equal to the sum of the lengths of said second sides of the modules.

* * * * *